United States Patent [19]
Feldner

[11] Patent Number: 6,016,008
[45] Date of Patent: Jan. 18, 2000

[54] INTEGRATED CIRCUIT INTERCONNECTION EMPLOYING TUNGSTEN/ALUMINUM LAYERS

[75] Inventor: Klaus Feldner, Fishkill, N.Y.

[73] Assignee: Siemens Aktiengesellschaft, Munich, Germany

[21] Appl. No.: 09/024,998

[22] Filed: Feb. 17, 1998

Related U.S. Application Data

[63] Continuation of application No. 08/413,557, Mar. 30, 1995, abandoned.

[51] Int. Cl.[7] .......................... H01L 23/48; H01L 23/52; H01L 29/40
[52] U.S. Cl. .......................... 257/751; 257/763; 257/764; 257/765; 257/382
[58] Field of Search .................................. 257/750, 751, 257/763, 382, 383, 765, 764; 438/625, 627, 648, 656, 233

[56] References Cited

U.S. PATENT DOCUMENTS

| | | | |
|---|---|---|---|
| 4,997,789 | 3/1991 | Keller et al. | 438/643 |
| 5,141,897 | 8/1992 | Manocha et al. | 438/625 |
| 5,155,063 | 10/1992 | Ito | 438/637 |
| 5,192,703 | 3/1993 | Lee et al. | 438/396 |
| 5,200,539 | 4/1993 | Stanley et al. | 556/21 |
| 5,202,287 | 4/1993 | Joshi et al. | 438/653 |
| 5,219,789 | 6/1993 | Adan | 438/645 |

*Primary Examiner*—Olik Chaudhuri
*Assistant Examiner*—Phat X. Cao
*Attorney, Agent, or Firm*—Stanton C. Braden

[57] ABSTRACT

An improved integrated circuit interconnection for interconnecting at least two conductive regions within an integrated circuit, and method for producing the same. The interconnection includes a tungsten layer and a barrier layer to provide a low contact resistance within the interconnection and between the conductive regions and the interconnection. The interconnection also includes an aluminum layer for providing a low sheet resistance in the current path between the two conductive regions. Thus the invention combines the advantages of an all tungsten interconnection with those of a tungsten capsuled aluminum interconnection.

2 Claims, 8 Drawing Sheets

INTEGRATED CIRCUIT INTERCONNECTION EMPLOYING TUNGSTEN/ALUMINUM LAYERS

This application is a continuation of 08/413,557, filed Mar. 30, 1995, abandoned.

FIELD OF THE INVENTION

This invention relates in general to integrated circuit interconnections and more particularly to interconnections including tungsten and aluminum layers for low contact and sheet resistances and high reliability.

BACKGROUND OF THE INVENTION

As integrated circuits have become increasingly miniaturized, the need to provide low resistance and highly reliable device interconnections has become more critical. Much attention has been placed upon improving the metallurgical contacts which interconnect metallic circuit nodes and doped semiconductor regions of integrated circuit devices.

A considerable effort has been geared towards developing interconnections and associated manufacturing processes which include the use of tungsten filled contacts. Tungsten is a refractory metal having a low resistance and relatively high temperature stability which makes its use attractive. The development of improved selective chemical vapor phase deposition (CVD) processes has made tungsten a prime candidate to replace the metal silicides conventionally used in interdevice contacts.

When tungsten (W) is used to fill via holes that extend to semiconductor device impurity regions, it is customary to include a barrier layer such as titanium (Ti) or titanium nitride (TiN) between the tungsten and the semiconductor material. The barrier layer enhances adhesion and lowers the contact resistance between the tungsten layers and the impurity regions. A TiN layer may be deposited, for example, by sputtering prior to tungsten deposition by low pressure CVD, sputtering or electron beam evaporation.

While the advantages of tungsten are thus well established, especially in providing low contact resistance interconnects, it has a relatively high sheet resistance in comparison to other metals, such as aluminum (Al). In device interconnects having long current paths, it is therefore advantageous to include aluminum for lowering the interconnect resistance. Now, it is well known that it is poor practice to directly form metals such as aluminum on impurity diffusion regions in a silicon substrate. This results in alloy spikes and/or silicon nodules produced by reaction between aluminum and silicon due to thermal hysteresis. To prevent these problems, it is known to use a barrier metal layer such as Ti and/or TiN between the aluminum and the silicon substrate. Also, a Ti or TiN barrier layer is used to prevent direct aluminum contact with dielectrics such as silicon dioxide ($SiO_2$) used as isolators within the integrated circuit. However, a problem in the manufacture of interconnects using aluminum with Ti and/or TiN is that oxidation of the aluminum often occurs in the interface between the aluminum and barrier layers or between the aluminum and tungsten layers. This oxidation significantly increases the contact resistance of the Al/barrier layers or Ae/w layers and lowers the reliability of the contact.

A prior art interconnect structure including both tungsten and aluminum layers, and formed from a "dual damascene" process is shown in FIG. 1. The dual damascene process referred to herein is a process in which a metallic "runner" layer along with via hole conductive fillers are formed in one process step. The via holes extend down to conductive regions of the integrated circuit which are to be electrically connected by the interconnect. The runner layer connects the via hole conductive fillers to couple the conductive regions of the circuit. Since the conductive regions may be a relatively considerable distance away from each other, it is desirable that the runner layer be comprised of a metal with a low sheet resistance such as aluminum.

In FIG. 1, via holes 24, 26 and a runner opening 28 are first formed within an insulating body 16 such as silicon dioxide ($SiO_2$). The via holes 24 and 26 are shown to extend down to tungsten contact regions 14 and 15. Barrier layers 13 and 17, such as Ti and/or TiN, separate tungsten contact regions 14 and 15 from impurity regions 19 and 21 (which are formed within a silicon substrate 25). In the dual damascene process, via holes 24 and 26 and runner opening 28 are simultaneously filled with conductive material in one process step. A Ti and/or TiN barrier layer 22 is first applied within openings 28, 24 and 26. Aluminum layers 20 are then formed over barrier layer 22 by sputtering. Another barrier layer 25 is deposited over the aluminum layers 20. Finally, a thick tungsten layer 12 is applied to fill the remainder of the via hole openings 24, 26 and runner opening 28. This tungsten layer 12 thus encapsulates the aluminum layers, thereby providing a high reliability configuration in the metallic runner region. In the resulting configuration the current that flows between conductive regions 19 and 17 generally flows in the vicinity of current path 31. It is seen that a substantial portion of current path 31 is within the aluminum layers 20 such that a low sheet resistance is provided.

However, a shortcoming of the FIG. 1 interconnection configuration is that the current has to flow through many critical interfaces. As shown, current path 31 crosses aluminum/barrier layer interfaces 27, 23, 30 and 18, and runs along interface 29. These interfaces are prone to oxidation problems, resulting in potentially poor contact resistance and a high interconnection failure rate.

Accordingly, it is an object of the present invention to provide an integrated circuit interconnection which has improved contact resistance and higher reliability while also having a low sheet resistance.

It is a further object of the present invention to provide a dual damascene process to fabricate an improved integrated circuit interconnection.

These and other objects and advantages of the present invention will become apparent to those of ordinary skill in the art having reference to the following detailed description of an exemplary embodiment thereof.

SUMMARY OF THE INVENTION

The present invention is directed to an improved integrated circuit interconnection for interconnecting at least two conductive regions within an integrated circuit. The interconnection includes a tungsten layer and a conductive barrier layer to provide a low contact resistance within the interconnection and between the conductive regions and the interconnection. The interconnection also includes an aluminum layer for providing a low sheet resistance in the current path between the two conductive regions. Thus the invention combines the advantages of an all tungsten interconnection with those of a tungsten capsuled aluminum interconnection.

According to a first illustrative embodiment of the invention, the interconnection comprises an aluminum layer, a first tungsten layer between the aluminum layer and a first conductive barrier layer for improving the contact resistance of the interconnection, the first conductive barrier layer being between the conductive regions and the first tungsten layer, a second conductive barrier layer on the aluminum layer and a second tungsten layer on the second barrier layer.

According to another illustrative embodiment, the interconnection comprises at least first and second tungsten plugs; a dielectric region between the tungsten plugs; a conductive barrier layer comprised of at least three sections: a first section between the first conductive region and the first tungsten plug, a second section between the second conductive region and the second tungsten plug, and a third section disposed on the dielectric region and joining the first and second sections of the barrier layer; a first aluminum layer between the first tungsten plug and the first barrier layer section; a second aluminum layer between the second tungsten plug and the second barrier layer section; a third aluminum layer on the third barrier layer section; and a tungsten layer between the barrier layer and the aluminum layers for improving contact resistance of the interconnection.

The present invention is also directed towards a method of fabricating an integrated circuit interconnection for interconnecting at least first and second conductive regions within an integrated circuit. The method comprises the steps of: forming at least first and second via holes in a dielectric body of the integrated circuit, where the first via hole extends to the first conductive region, and the second via hole extends to the second conductive region; forming a first runner opening within the dielectric body between the via holes; depositing a first conductive barrier layer on the first and second conductive regions within the via holes and in a third region between the via holes; depositing a first tungsten layer on the barrier layer; forming an aluminum layer on the first tungsten layer; depositing a second barrier layer on the aluminum layer; and depositing a second tungsten layer on the second barrier layer.

BRIEF DESCRIPTION OF THE DRAWINGS

For a better understanding of the present invention, reference is made to the following description of an exemplary embodiment thereof, considered in conjunction with the accompanying drawings, in which.

DETAILED DESCRIPTION OF THE INVENTION

The integrated circuit interconnection according to this invention employs a tungsten layer and a conductive barrier layer for directly contacting conductive regions to be interconnected within an integrated circuit. Contact resistance and interconnection reliability are thereby enhanced. In addition, an aluminum layer is formed on the tungsten layer, resulting in improved sheet resistance, as will be described.

Figure 1:
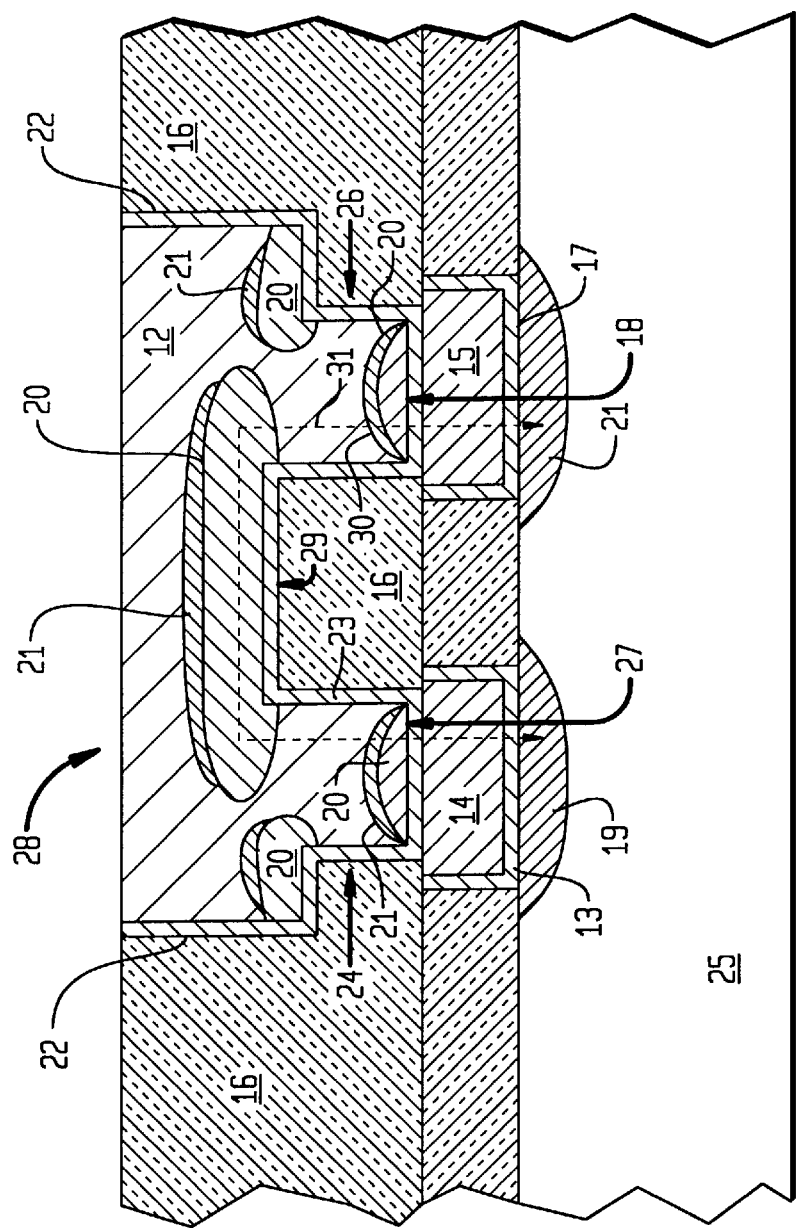
FIG. 1 shows a prior art integrated circuit interconnection employing aluminum and tungsten layers.
Figure 2:
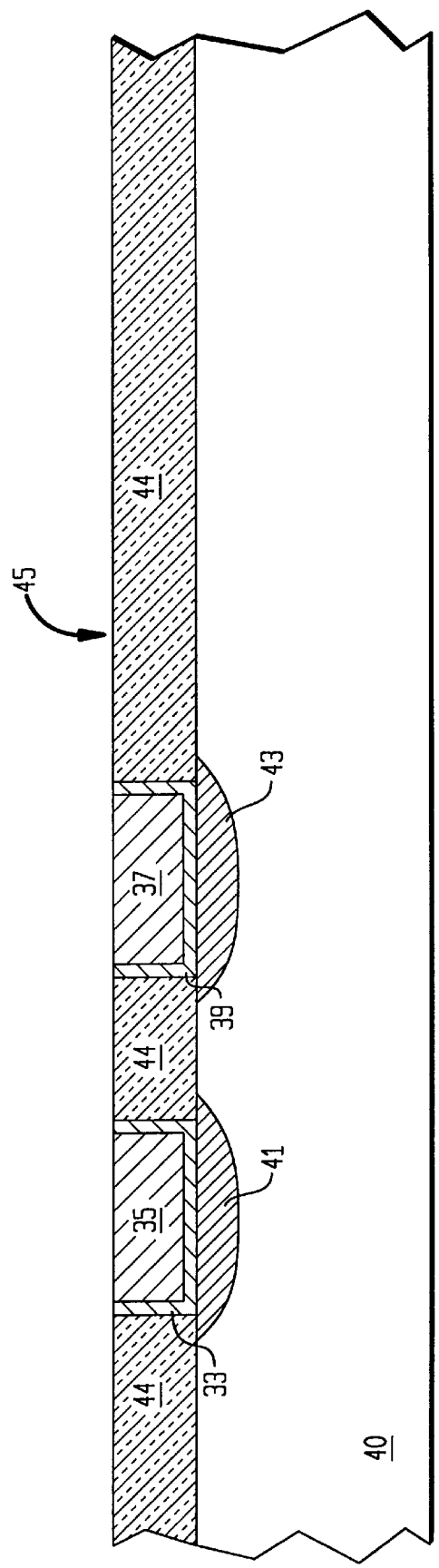
FIGS. 2–5 show intermediate process steps in the formation of an integrated circuit interconnect according to the present invention.
Figure 4:
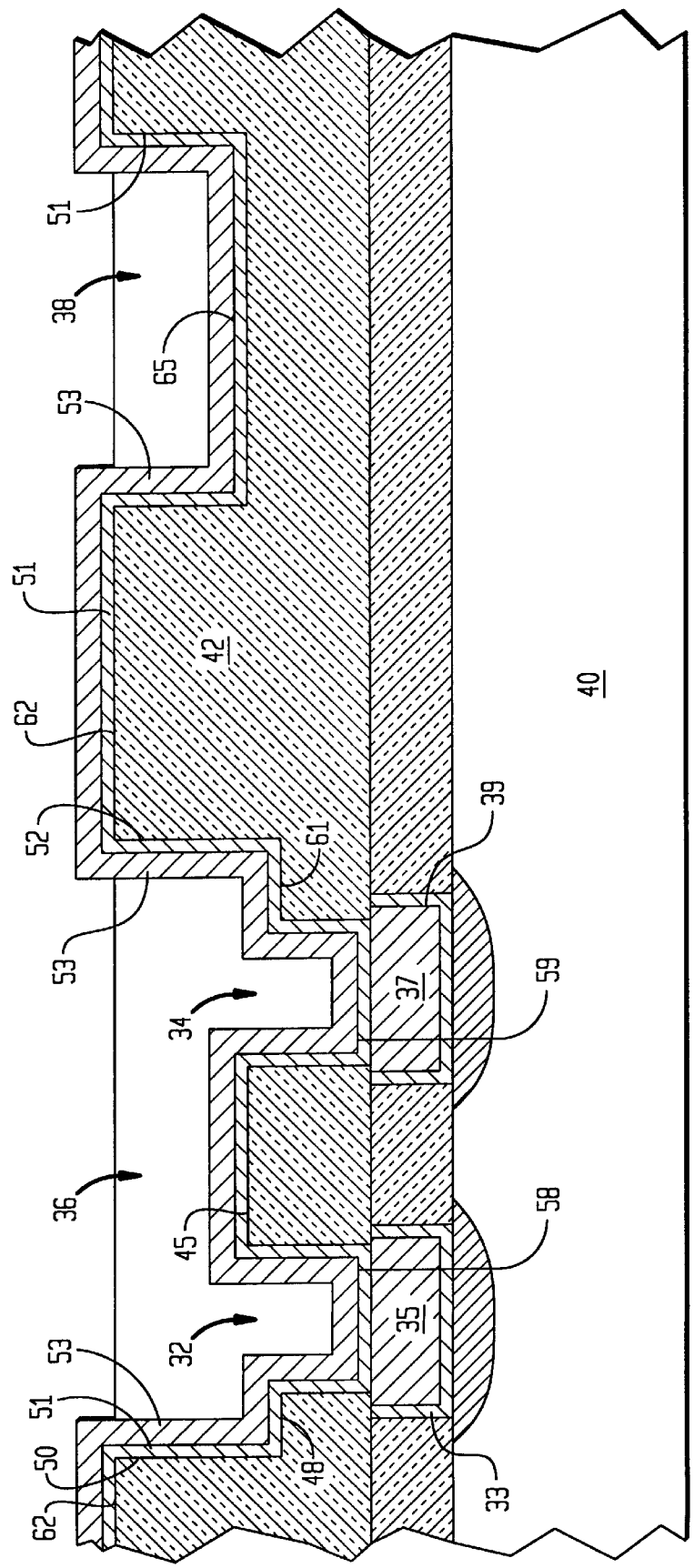
Figure 5:
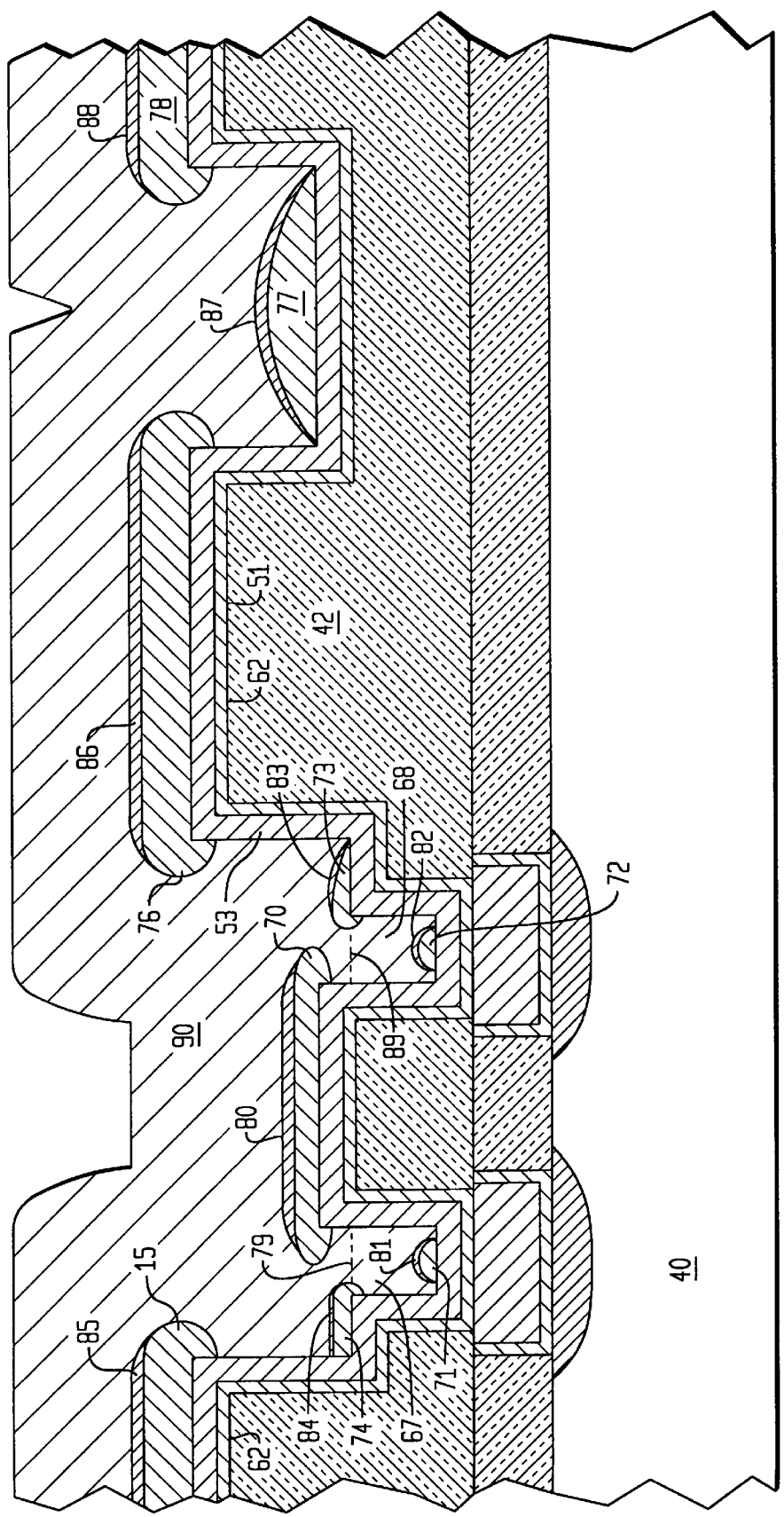
Figure 6:
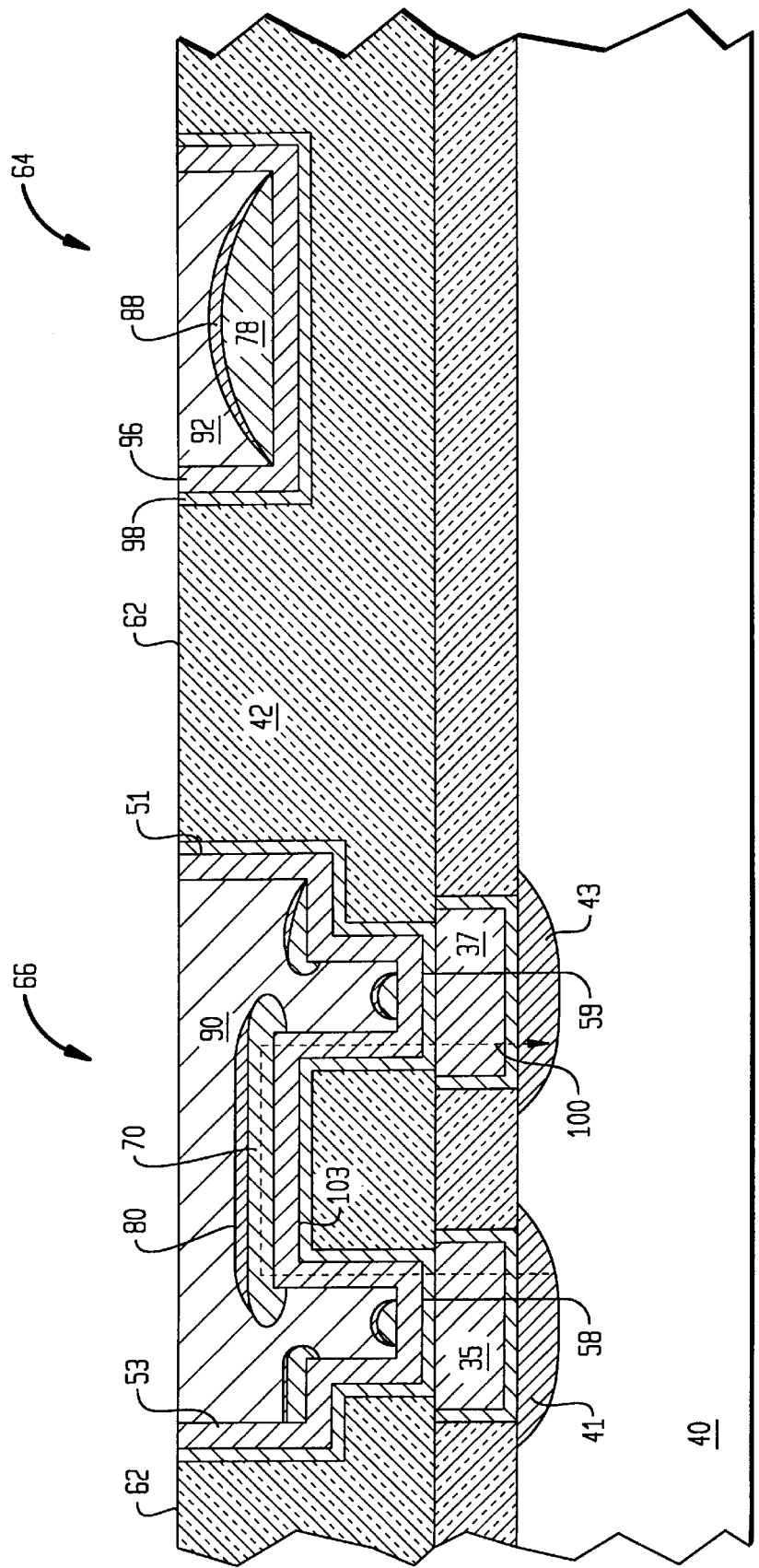
FIG. 6 shows an integrated circuit interconnection according to the present invention having improved contact resistance and low sheet resistance.

Shown in FIGS. 2–5 are intermediate structures in the fabrication of an interconnection according to the invention, of which a completed interconnection is shown in FIG. 6. Referring now to FIG. 2, a cross sectional view of a portion of an integrated circuit is shown. Starting with a silicon or GaAs substrate 40, doped conductive regions 41 and 43 are formed. While the interconnection to be described will be shown to interconnect doped regions 41 and 43, it can also be used to interconnect a plurality of metallic circuit nodes beneath the integrated circuit interface.

A first dielectric layer 44 is deposited over conductive regions 41 and 43. Dielectric layer 44 may be silicon dioxide ($SiO_2$) such as a thermal oxide or tetra-ethyl-ortho-silicate (TEOS) oxide. Openings are then created within layer 44 and above regions 41 and 43 using plasma etching or other techniques known in the art. Within these openings, barrier layers 33 and 39 are deposited. Barrier layers 33 and 39 may be titanium (Ti) and/or titanium nitride (TiN). Tungsten plugs 35 and 37 are then respectively formed over barrier layers 33 and 39. For example, to comprise barrier layers 33, 39 of Ti and TiN, a TiN film may be formed by reactive sputtering using titanium as a target electrode in a mixture gas of argon (Ar) and nitrogen gas ($N_2$) as sputtering atmosphere. A subsequent heat treatment may then be performed by lamp annealing with nitrogen gas or $NH_3$ gas. By this heat treatment, the titanium film within the contact hole is silicided from the side of the silicon substrate while non-reacted titanium of the titanium nitride film and the titanium film are nitrided from the side of the sputtering gas. As a result, the performance of the titanium film as the barrier metal is improved and the contact resistance is reduced. Other suitable methods for depositing a Ti/TiN film on a semiconductor device are disclosed in U.S. Pat. No. 5,155,063 entitled "Method of Fabricating Semiconductor Device Including an Al/TiN/Ti Contact", issued on Oct. 13, 1992 to N. Ito.

A low contact resistance between the barrier layers 33, 39 and the impurity regions 41, 43 is thus furnished. The barrier layers 33 and 39 enhance adhesion between the tungsten plugs and the silicon, resulting in low contact resistance between tungsten plugs 35, 37 and conductive regions 41, 43.

In any event, the tungsten plugs 35 and 37 may be deposited by a variety of processes known in the art such as low pressure chemical vapor phase deposition (LPCVD), sputtering, or electron beam evaporation. The preferred technique is a CVD process known as "selective tungsten", generally known as one in which tungsten is selectively formed on silicon, metals or silicide surfaces but will not adhere to silicon dioxide. Thus, the tungsten plugs 35, 37 in FIG. 2 will adhere to barrier layers 41, 43 within the via holes, but will not produce any significant accumulation on the top surface 45 of $SiO_2$ layer 44. In accordance with the preferred CVD technique, tungsten is selectively deposited on the exposed metal barrier layers 33, 39 by placing the substrate 40 in a CVD reactor where it is heated. Tungsten hexafluoride ($WF_6$) is then reduced by hydrogen or silicon under process conditions that favor selectively. The selectively process then fills the openings from the bottom up and the resulting tungsten plugs do not generally exhibit central seams.

Figure 3:
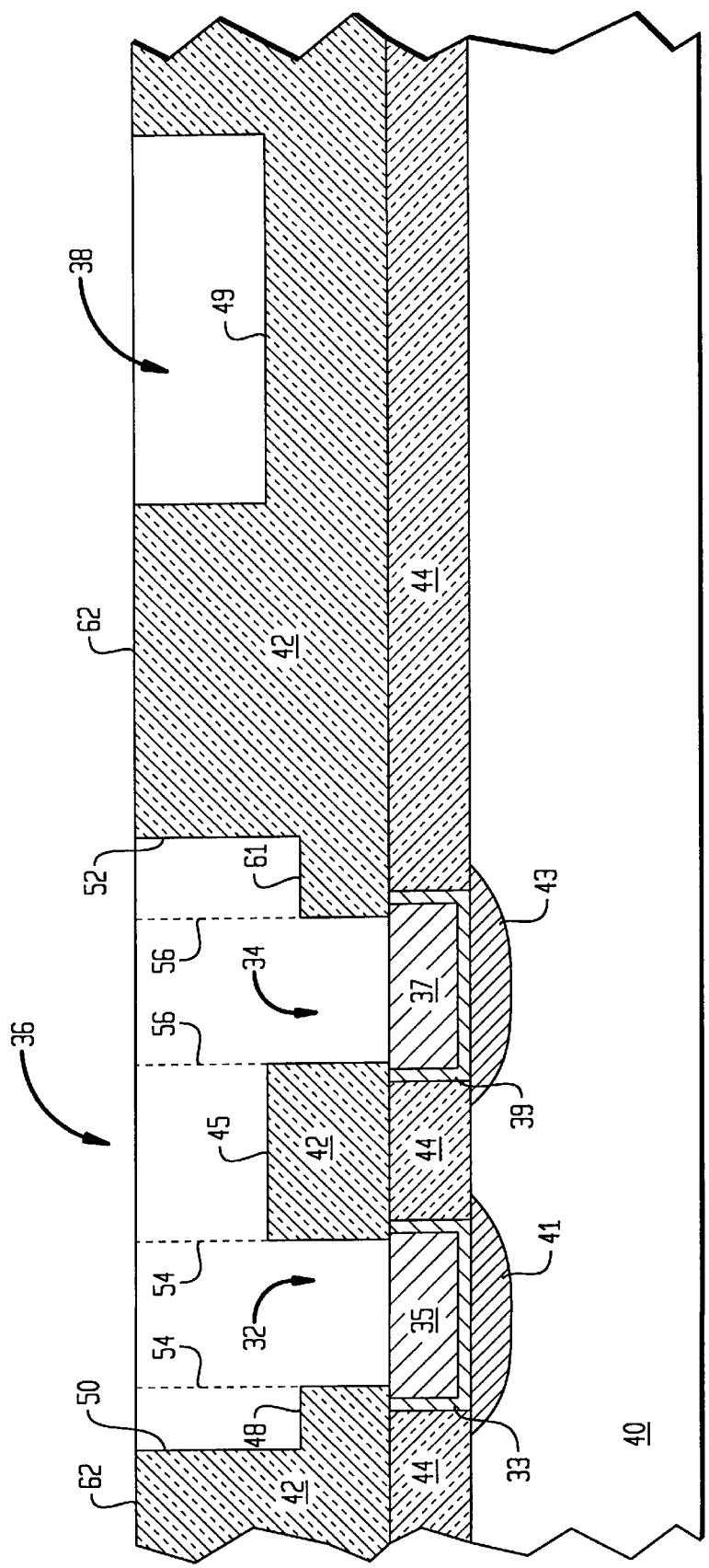

Following the deposition of tungsten plugs 35 and 37, a second dielectric layer 42, also preferably $SiO_2$, is deposited over dielectric layer 44 and over tungsten plugs 35, 37 as indicated in FIG. 3. FIG. 3 shows via holes 32, 34 and runner openings 36, 38 which are subsequently created within dielectric layer 42 by standard photolithographic techniques.

Preferably, via holes 32, 34 are created prior to creating runner openings 36 and 38. In this case, via holes 32, 34 are opened from the top surface 62 of dielectric layer 42 within sidewall boundaries 54 and 56, respectively. Runner opening 36 is then formed with left and right boundaries 50, 52 and bottom surfaces 45, 48 and 61. While FIG. 3 shows the left and right bottom surfaces 48 and 61 to be at a lower depth than that of the center bottom surface 45, these depth levels are a matter of design choice. Surfaces 48 and 61 may alternatively lie at the same depth as surface 45 or may even be at shallower depths. Also, the surface 49 of runner opening 38 is preferably at the same depth level as surface 45 but may be varied as a matter of design choice.

While via holes 32, 34 are shown to extend to the top surfaces of tungsten plugs 35, 37 they may alternatively extend down directly to impurity regions 41, 43. In this embodiment, tungsten plugs 35, 37 with associated barriers 33 and 39 would not exist but instead, the via holes 32, 34 would also be formed within dielectric layer 44. Of course, in this latter case it would not be necessary to have two separate dielectric regions 42 and 44. Other embodiments are also possible in which via holes 32 and 34 extend down to lower level metallic circuit nodes (not shown) within the integrated circuit in order to selectively interconnect these lower level nodes.

In any event, the exact shapes of via holes 32, 34 and runner openings 36, 38 are not critical. Practical contemporary lithography often produces openings with somewhat circular cross-sections, but they may just as well be square, rectangular or conical. In addition, as seen in FIG. 3, via holes 32 and 34 are centered relative to tungsten plugs 35, 37. Alternatively, they could just as well be offset from tungsten plugs 35, 37 as a result of manufacturing tolerances or by design. The interconnection according to the invention will still be operational in such an offset configuration so long as some overlap exists between the via holes 32, 34 and the tungsten plugs 35, 37. However, the greater overlap area, the lower the contact resistance will be between tungsten plugs 35, 37 and the conductive material which subsequently fills the via holes 32, 34, as will be described.

Referring now to FIG. 4, a continuous conductive barrier layer 51 is deposited over the entire surface of the intermediate structure of FIG. 3. Barrier layer 51 may be Ti and/or TiN and deposited using the same or similar methods as those described above for deposition of barrier layers 33 and 39. In what is termed a "dual damascene" process, barrier layer 51 is deposited in one process step within the via holes 32 and 34 which are situated at a first depth level, and along the perimeter surfaces of runner openings 36 and 38, which are at a second depth level. The dual damascene process thereby avoids additional deposition and polishing steps which would otherwise be necessary.

A continuous tungsten layer 53 is then formed over barrier layer 51. Tungsten layer 53 may be deposited using the same or similar methods to those described above for the formation of tungsten plugs 35 and 37. Now, the barrier layer 51 functions to enhance the adhesion between tungsten layer 53 and the surrounding dielectric 42. In addition, high reliability and low contact resistance interfaces (including, for example, interfaces 58, 59 and 65) are provided between the tungsten and barrier layers 53 and 51.

Referring to FIG. 5, aluminum is sputtered in one process step over the tungsten layer 53 to form aluminum layers 70–78 generally on the horizontal surfaces of the tungsten layer 53. Because the aluminum is applied directionally by the sputtering operation, the aluminum does not generally adhere to the vertical sidewalls of the tungsten layer 53. Rather, an aluminum overhang results along the top edges of the tungsten sidewalls. (In addition, while the aluminum deposition is described for convenience as resulting in several separate layers 70–78 of aluminum, it could just as well be said to consist of one non-contiguous layer of aluminum deposited over the tungsten layer 53).

Following the aluminum sputtering, barrier layers 80–88 are deposited in one process step over the aluminum layers 70–78. Barrier layers 80–88 are preferably comprised of the same material as barrier layer 51—i.e., Ti and/or TiN, and deposited using the same or similar method as used for barrier layer 51. While the barrier layer deposition is being described for convenience as resulting in several separate barrier layers 80–88, it could just as well be said to consist of one non-contiguous barrier layer deposited over a non-contiguous aluminum layer. In addition, barrier layers 80–88 are shown to adhere only to the aluminum layers 70–78 and not to the vertical sidewalls of tungsten layer 53. However, barrier layers 80–88 may alternatively be applied such that they do adhere to the tungsten layer 53 sidewalls, without significantly impacting the integrity of the interconnection.

A thick tungsten layer 90 is then deposited to cover barrier layers 80–88 and the remaining surfaces of the aluminum layers 70–78 and the tungsten layer 53. Tungsten layer 90 may thus be said to encapsulate the aluminum layers 70–78 and may therefore be referred to a tungsten "capsule". By the tungsten layer 90 encapsulating the aluminum layers 70–78, a high reliability structure results in the upper level runner regions. (If the barrier layers 80–88 are deposited to adhere to the vertical sidewalls of tungsten layer 53, as described above, then the tungsten capsule 90 does not directly contact tungsten layer 53 but rather, barrier layers 80–88 would then be between tungsten layer 53 and tungsten capsule 90). The regions 67 and 68 of tungsten layer 90 respectively below depth levels 79 and 89 fill the original via holes 32 and 34 (see FIG. 4). Regions 67 and 68 may therefore for convenience be termed "tungsten via hole plugs". These tungsten via hole plugs 67 and 68 are integral with the tungsten capsule 90, and together with tungsten layer 53, provide a high reliability in the lower level via hole regions 32, 34 in proximity to the conductive regions that are to be interconnected.

The top surface of the intermediate structure of FIG. 5 is then polished down using a suitable chemical mechanical polishing (CMP) technique, as is commonly known in the art. The polishing is performed on the layers disposed above top surface 62 of dielectric body 42, resulting in the structure of FIG. 6.

In the FIG. 6 cross sectional view, two electrically isolated structures result-interconnecting structure 66 and runner 64. Runner 64 consists of the layers remaining within runner opening 38, i.e., barrier layer 98, tungsten layers 96 and 92 (the respective portions of barrier layer 51 and tungsten layers 53 and 90 within runner opening 38), aluminum layer 78 and barrier layer 88.

Within the interconnection structure 66, current flowing between conductive regions 41 and 43 will be substantially confined to current path 100. It is seen that current path 100 does not encounter any Al/Ti or Al/TiN interfaces which would otherwise have a high contact resistance and/or tend to oxidize and be unreliable. Instead, current path 100 only passes through low contact resistance and high reliability W/Ti or W/TiN interfaces 58, 59 and W/Al interface 103. In addition, the horizontal portion of current path 101 lies substantially within aluminum layer 70, rather than within tungsten layer 53 or barrier layer 51. This is due to the lower sheet resistance of the aluminum relative to that of the tungsten, Ti or TiN. The current thus substantially takes the path of least resistance through the aluminum. Thus the overall interconnection structure 66 combines the advantages of a tungsten capsuled aluminum design (low sheet resistance and high reliability in upper level runner regions) with those of an all tungsten design (low contact resistance and high reliability in lower level via hole regions).

Figure 7:
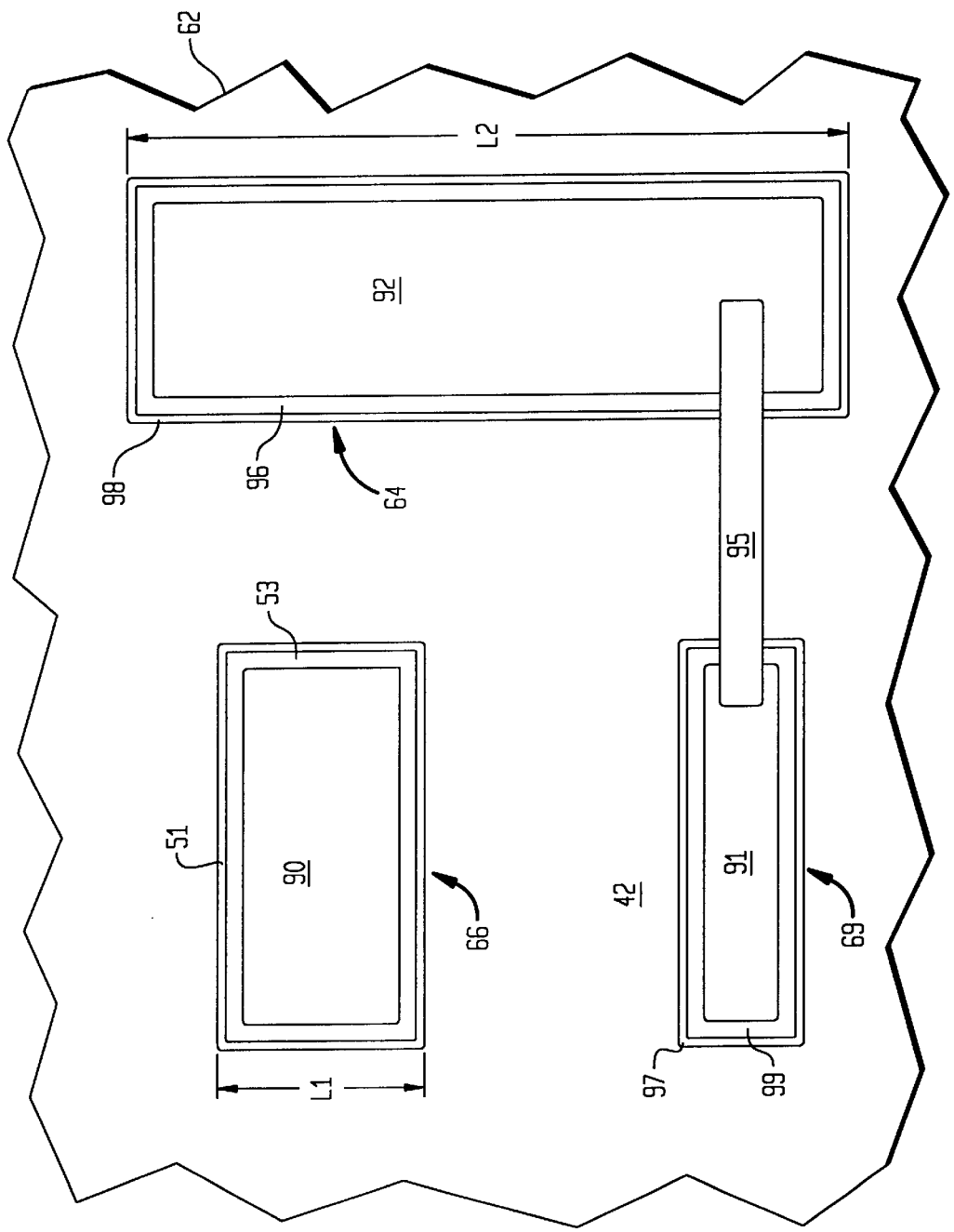
FIG. 7 shows a top view of the interconnection of FIG. 6, including an additional interconnection structure.

FIG. 7 shows a top view of the structure of FIG. 6, facing top surface 62 of dielectric body 42. It is seen that runner 64 may have a length L2 that is substantially longer than the length L1 of interconnecting structure 66 (lengths L1 and L2 are perpendicular to the FIG. 6 cross section). For example, L1 may be 0.5 microns while L2 may be in excess of 10 microns. L2 is a relatively long length in order for runner 64 to be adaptable to selectively make electrical contact with a variety of interconnecting structures or with other conductive surfaces within the integrated circuit. Shown in FIG. 7 is a top view of another interconnecting structure 69. For the sake of illustration, structure 69 is similar to structure 66, having a barrier layer 97, tungsten layer 99 and tungsten capsule 91 similar to layers 51, 53 and 90, respectively. The interconnect structure 69 may interconnect two or more semiconductor impurity regions and/or metallic regions within the integrated circuit. In addition, similar layers of structures 69 and 66 (e.g.—layers 97 and 51) may be formed simultaneously in one process step. A conductive bridge 95, typically tungsten, is shown to make electrical contact between the tungsten cap 92 of runner 64 and tungsten cap 91 of interconnecting structure 69. Bridge 95 may be formed by tungsten deposition in a manner similar to that of formation of tungsten plugs 35 and 37 (of FIG. 2) described above.

Figure 8:
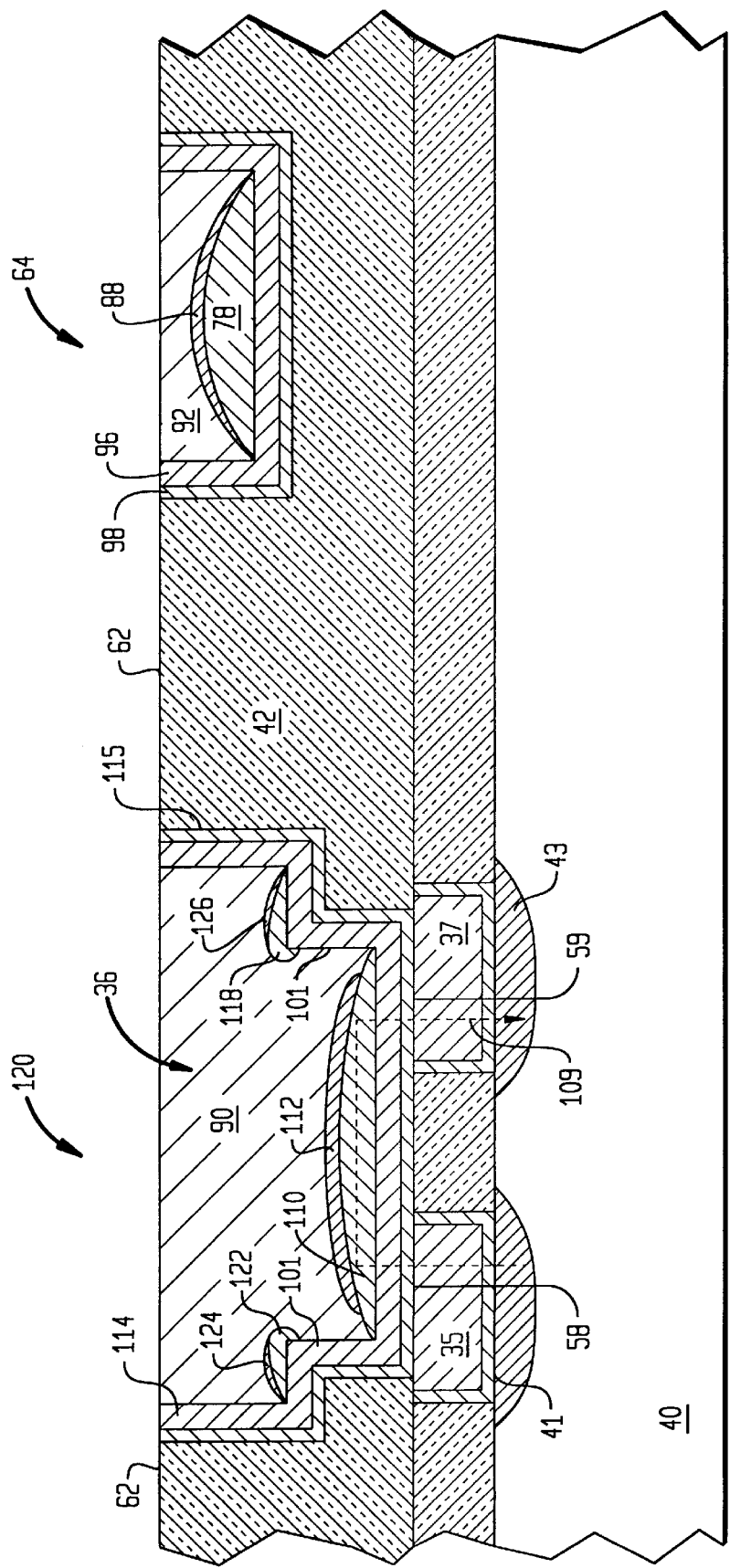
FIG. 8 shows an alternate embodiment of an integrated circuit interconnection according to the present invention.

An alternate embodiment of the interconnection according to the present invention is shown in FIG. 8. The interconnection structure 66 of FIG. 6 is replaced by interconnection structure 120 of FIG. 8. Otherwise, the same reference numerals designate the same features of the FIG. 6 embodiment. It is seen that in FIG. 8, the portion of dielectric region 42 between the regions above tungsten plugs 35 and 37 has been eliminated. Thus, instead of forming separate via holes 32 and 34 extending to the tungsten plugs, only one via hole extending to both tungsten plugs 35 and 37 is necessary. Barrier layer 115 (preferably Ti and/or TiN) then replaces barrier layer 51 of FIG. 4. Tungsten layer 114 replaces tungsten layer 53 of FIG. 4. Aluminum layers 110, 122 and 118 are formed over tungsten layer 114 by aluminum sputtering. Barrier layers 112, 124 and 126 of Ti and/or TiN are deposited over the aluminum layers. Tungsten capsule 90 is then deposited over the remaining exposed surfaces within runner opening 36. Finally, CMP polishing is performed in the same or similar manner as described above to polish away the intermediate layers above surface 62 (For convenience, intermediate layers of tungsten, aluminum, etc. disposed between interconnection structure 120 and runner 64 are omitted from FIG. 8). In the resulting structure of FIG. 8, the current flowing between conductive regions 41 and 43 flows substantially in the current path 109. It is seen that the horizontal portion of current path 109 lies substantially within aluminum layer 110 such that a low sheet resistance is provided. Also, only low contact resistance interfaces including W/Ti or W/TiN interfaces 58 and 59 lie within current path 109. Hence, a low sheet resistance, low contact resistance and high reliability interconnection is also provided by the alternate embodiment of FIG. 8.

From the foregoing, disclosed is an improved integrated circuit interconnection for interconnecting at least two conductive regions within an integrated circuit. A key advantage of this interconnection is that it combines the advantages of a tungsten capsuled aluminum interconnection (low sheet resistance and high reliability in upper level metallic runner regions) with those of an all tungsten interconnection (low contact resistances and high reliability in lower level via hole regions). Another advantage of the instant invention is that it provides a dual damascene process for one step deposition of metallic layers at different depth levels within the integrated circuit.

It should be understood that the embodiments described herein are merely exemplary and that a person skilled in the art may make many variations and modifications without departing from the spirit and scope of the invention. All such modifications are intended to be included within the scope of the invention as defined in the appended claims.

What is claimed:

1. An integrated circuit interconnection for interconnecting at least first and second conductive regions in a substrate, said interconnection comprising:
    a dielectric layer disposed above said substrate;
    a runner disposed in said dielectric layer above said first and second conductive regions,
    a first conductive barrier layer being disposed within said runner and spanning between said first and second conductive regions, said first conductive barrier layer being continuous;
    a first aluminum layer overlying said first contiguous conductive barrier layer;
    a second conductive barrier layer overlying said first aluminum layer;
    a first tungsten layer overlying said second conductive barrier layer; and
    a second tungsten layer disposed between said first contiguous conductive barrier layer and said first aluminum layer, said second tungsten layer being configured to prevent a direct contact between said first aluminum layer with said first conductive barrier layer.

2. The interconnection according to claim 1 further comprising:
    a third tungsten layer disposed between said first conductive region and said first conductive barrier layer; and
    a third conductive barrier layer disposed between said third tungsten plug and said first conductive region.

* * * * *